United States Patent
Suvkhanov et al.

(10) Patent No.: US 7,148,131 B1
(45) Date of Patent: Dec. 12, 2006

(54) METHOD FOR IMPLANTING IONS IN A SEMICONDUCTOR

(75) Inventors: Agajan Suvkhanov, Portland, OR (US); Mohammad Mirabedini, Redwood City, CA (US)

(73) Assignee: LSI Logic Corporation, Milpitas, CA (US)

( * ) Notice: Subject to any disclaimer, the term of this patent is extended or adjusted under 35 U.S.C. 154(b) by 316 days.

(21) Appl. No.: 10/226,884

(22) Filed: Aug. 23, 2002

(51) Int. Cl.
*H01L 21/425* (2006.01)

(52) U.S. Cl. ............ 438/514; 438/530; 438/914

(58) Field of Classification Search ........... 438/514, 438/527, 530, 531, 914, FOR. 161, FOR. 172, 438/FOR. 204
See application file for complete search history.

(56) References Cited

U.S. PATENT DOCUMENTS 6,274,466 B1 * 8/2001 Hsu et al. ................ 438/519
6,483,155 B1 * 11/2002 Wada et al. ............... 257/397
2002/0174828 A1 * 11/2002 Vasat et al. ................ 117/90

OTHER PUBLICATIONS

Wolf,Silicon Processing for the VLSI Era, Lattice Press, 1986, vol. 1, pp. 56-61.*
Wolf et al. "Process Technology", Silicon Processing for the VLSI Era, pp. 280-281 (Lattice Press 1986).*
Optimum Halo Structure for Sub-0.1 μm CMOSFETs, Wen-Kuan Yeh and Jih-Wen Chou, IEEE Transactions on Electron Devices, vol. 48, No. 10, Oct. 2001.
High Performance 35 nm Gate Length CMOS with NO Oxynitride Gate Dielectric and Ni Salicide, s. Inaba, et al., 2001 IEEE.

* cited by examiner

*Primary Examiner*—Matthew Smith
*Assistant Examiner*—Thanh V. Pham
(74) *Attorney, Agent, or Firm*—Barnes & Thornburg

(57) ABSTRACT

A method for implanting ions in a semiconductor is disclosed. The method includes implanting indium ions into a substrate of a semiconductor material of the semiconductor device for a first time period. The method also includes implanting boron ions into the substrate for a second time period, wherein the first time period is initiated prior to the second time period.

16 Claims, 2 Drawing Sheets

METHOD FOR IMPLANTING IONS IN A SEMICONDUCTOR

TECHNICAL FIELD OF THE DISCLOSURE

The present disclosure generally relates to the manufacturing of semiconductors and more particularly relates to a method of implanting ions in a semiconductor.

BACKGROUND OF THE DISCLOSURE

As the dimensions of semiconductor devices scale down, adverse short channel effects become significant. One way to reduce short channel effects is by the creation and activation of a well confined band of dopants disposed within the semiconductor device. However, the efficient creation and activation of such a well confined band is problematic due to a number of factors including the diffusivity and activation characteristics of the implanted dopants. Accordingly a method of implanting ions in a semiconductor to help reduce short channel effects is desired.

SUMMARY OF THE DISCLOSURE

In accordance with one illustrative embodiment, a method of implanting ions in a silicon substrate is provided. The method includes advancing indium ions into the silicon substrate for a first time period. The method also includes advancing boron ions into the silicon substrate for a second time period. The time period for advancement of the indium ions is initiated prior to the time period for advancement of the boron ions.

In accordance with another illustrative embodiment, a method of disposing indium ions and boron ions below a surface of a semiconductor is provided. The method includes applying a mask structure adjacent to the semiconductor substrate. The mask structure includes an opening defined therein. Additionally, the method includes initiating the advancement of indium ions through the opening of the mask structure and into the semiconductor substrate. The method also includes advancing the boron ions through the opening of the mask structure and into the semiconductor substrate. The advancement of the indium ions is initiated prior to the advancement of the boron ions.

In accordance with still another illustrative embodiment, a method of fabricating a semiconductor device is provided. The method includes implanting indium ions into a substrate of a semiconductor material of the semiconductor device for a first time period. The method also includes implanting boron ions into the substrate for a second time period. The first time period is initiated prior to the second time period and the indium ions and the boron ions define a doped channel in the substrate.

DETAILED DESCRIPTION OF THE DISCLOSURE

Figure 1:
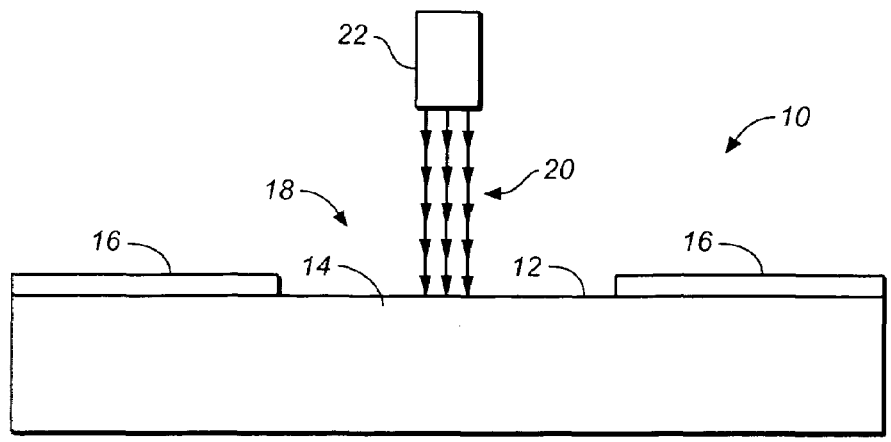
FIG. 1. is a cross sectional schematic representation of ions being implanted into a semiconductor substrate through an opening of a mask structure.

While the disclosure is susceptible to various modifications and alternative forms, specific embodiments thereof have been shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure as defined by the appended claims.

Referring now to FIG. 1, there is shown an implanter 22, a flow of ions 20, and a semiconductor device 10. The semiconductor device 10 includes a surface 12 and a substrate 14, for example silicon, germanium, or gallium compounds. A mask structure 16 having an opening 18 is applied adjacent to (e.g. in contact with) substrate 14 to improve control of the advancement of ions into substrate 14. The mask structure may include a low temperature oxide, photoresistive material, and/or other process blocking materials commonly known to one ordinarily skilled in the art.

Figure 2:
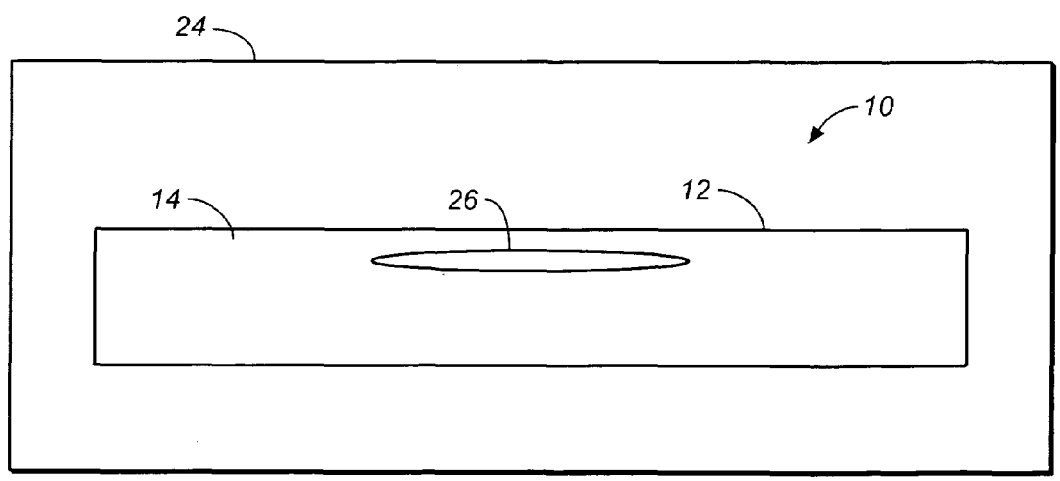
FIG. 2. is a schematic representation of the semiconductor device of FIG. 1 positioned in an annealing chamber after implantation of ions therein so as to define a doped channel within the semiconductor substrate.

In one illustrative embodiment, indium ions are advanced into substrate 14 for a first time period and boron ions are advanced into substrate 14 for a second time period. However, it should be understood that the advancement of the indium ions is initiated prior to the advancement of the boron ions. For example, indium ions are implanted in substrate 14 through opening 18 of mask structure 16 with implanter 22. In particular, one way of implanting indium ions through opening 18 of mask structure 16 with implanter 22 is to dope substrate 14 with an ion dose of about $0.8 \times 10^{13}$ indium ions per square centimeter by ion implanter 22 utilizing about 90 KeV acceleration voltage, about 7 degrees tilt, and about 23 degrees twist. With respect to the implantation of the boron ions, substrate 14 is doped to an ion dose of about $5 \times 10^{12}$ boron ions per square centimeter by ion implanter 22 utilizing about 25 KeV acceleration voltage, about 7 degrees tilt, and about 23 degrees twist. Advancing indium and boron ions into substrate 14 in the above described manner results in an indium ion and boron ion doped channel 26 being formed into the region of substrate 14 through opening 18 of mask structure 16 as shown in FIG. 2. It should be appreciated that a mask structure 16 can be applied adjacent to substrate 14 prior to the advancement of ions to control the dispersion of dopants within substrate 14. It should also be appreciated that the advancement of the indium ions and boron ions can occur in an environment which is substantially free of oxygen.

While the above described illustrative embodiment sets forth that doped channel 26 is created within a region delineated by the opening of the mask structure, it should be appreciated that other methods of delineating a region for the control of ion dispersion may be used.

Referring now to FIG. 2, there is schematically shown an annealing chamber 24 and semiconductor device 10 after being subjected to the above described method of implanting ions. In particular, semiconductor device 10 is positioned within annealing chamber 24 such that semiconductor device 10 can be subjected to, for example, an annealing process in a substantially oxygen free environment. It should be appreciated that the annealing process can include heating semiconductor device 10 for a period of time followed by cooling semiconductor device 10 for a period of time.

One way of annealing semiconductor device 10 in a substantially oxygen free environment is to conduct the annealing process in a nitrogen atmosphere. For example, the atmosphere contained within annealing chamber 24 can be a nitrogen atmosphere at a pressure of about 760 Torr to about 780 Torr. After placing semiconductor device 10 in annealing chamber 24 under a nitrogen atmosphere in the above described manner, semiconductor device 10 is heated to a temperature of about 550 degrees Celsius to about 1,000 degrees Celsius at a rate of about 35 degrees Celsius to about 75 degrees Celsius per second. Semiconductor device 10 is then maintained at about 550 degrees Celsius to about 1,000 degrees Celsius for about 10 seconds to about 30 seconds. Thereafter, semiconductor device 10 is cooled at a rate greater than 35 degrees Celsius per second. For example, a cooling rate of about 50 degrees Celsius per second to about 90 degrees Celsius per second can be utilized. In particular, a cooling rate of about 60 degrees Celsius per second to about 90 degrees per second can be employed. Illustratively, a cooling rate of about 80 degrees per second can be utilized. It should also be understood that helium can be advanced into annealing chamber 24 during the cooling process to support advanced rates of cooling. Annealing chamber 24 is then depressurized and semiconductor device 10 is removed from annealing chamber 24 for further processing. Illustratively, the above annealing process takes place subsequently to the advancement of indium and boron ions into substrate 14. In particular, the above annealing process occurs subsequently to the advancement of indium and boron ions into substrate 14 and prior to any additional processing steps. In particular, the above annealing process can occur prior to the deposition of dopant diffusion, for example, the deposition of source and drain dopants into semiconductor device 10.

Figure 3:
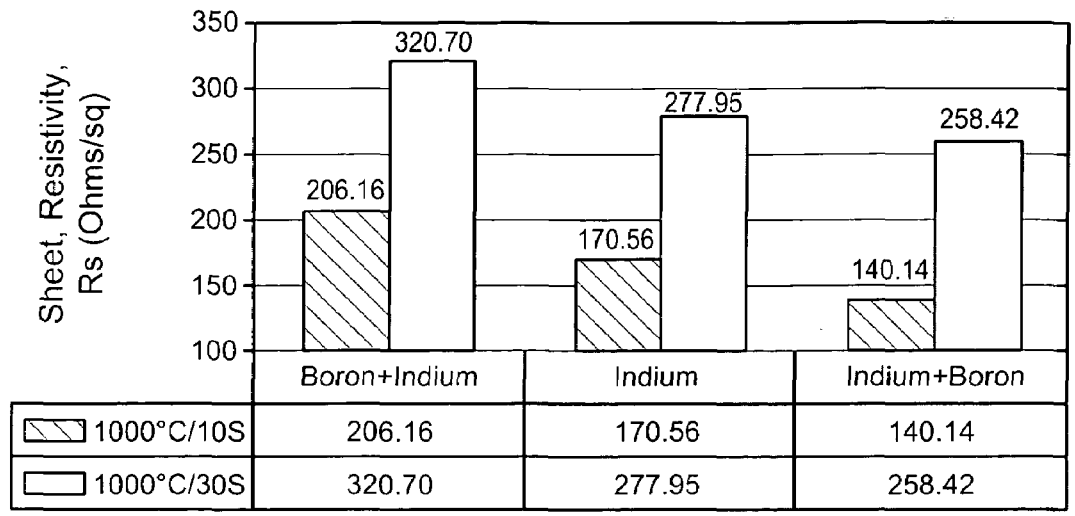
FIG. 3. is a graphical representation of sheet resistivity of a silicon substrate after rapid thermal process (RTP) annealing in which (i) boron ion implantation into the silicon substrate was initiated prior to indium ion implantation, (ii) indium ions alone were implanted into the silicon substrate, and (iii) indium ion implantation into the silicon substrate was initiated prior to boron ion implantation.

Now referring to FIG. 3, a graphical representation is shown of the resultant sheet resistivity of a doped channel created by one of three different ion implantation methods, i.e. (i) an implantation method which includes initiating the implantation of boron ions into a semiconductor substrate prior to initiating the implantation of indium ions into the semiconductor substrate (note that the data for the aforementioned method is indicated by a "Boron+Indium" label), (ii) an implantation method which includes the implantation of indium ions alone into a semiconductor substrate (note that the data for the aforementioned method is indicated by a "Indium" label), (iii) and an implantation method which includes initiating the implantation of indium ions into a semiconductor substrate prior to initiating the implantation of boron ions into the semiconductor substrate (note that the data for the aforementioned method is indicated by a "Indium+Boron" label). For each implantation procedure, two annealing processes are represented. The left bar associated with each of the above described labels (i.e. "Boron+Indium", "Indium", "Indium+Boron") depicts an annealing process wherein a semiconductor device is heated to and then maintained at a temperature of about 1,000 degrees Celsius for a time period of about 30 seconds. The semiconductor device is then cooled in a manner consistent with that described above. The right bar associated with each of the above described labels depicts an annealing process wherein a semiconductor device is heated to and then maintained at a temperature of about 1,000 degrees Celsius for a time period of about 10 seconds. The semiconductor device is then cooled in a manner consistent with that described above. It should be appreciated that, generally, a lower doped channel sheet resistivity is desired and, along with an increased activation of dopants at the same ion dose, results in a higher drive current. As shown in FIG. 3, the method of initiating the implantation of indium ions prior to initiating the implantation of boron ions results in a lower doped channel sheet resistivity for each annealing process which incorporates a 30 second maintenance time at about 1,000 degrees Celsius. In a similar fashion, FIG. 3 also shows that the method of initiating the implantation of indium ions prior to initiating the implantation of boron ions results in a lower doped channel sheet resistivity for each annealing process which incorporates a 10 second maintenance time at about 1,000 degrees Celsius.

Figure 4:
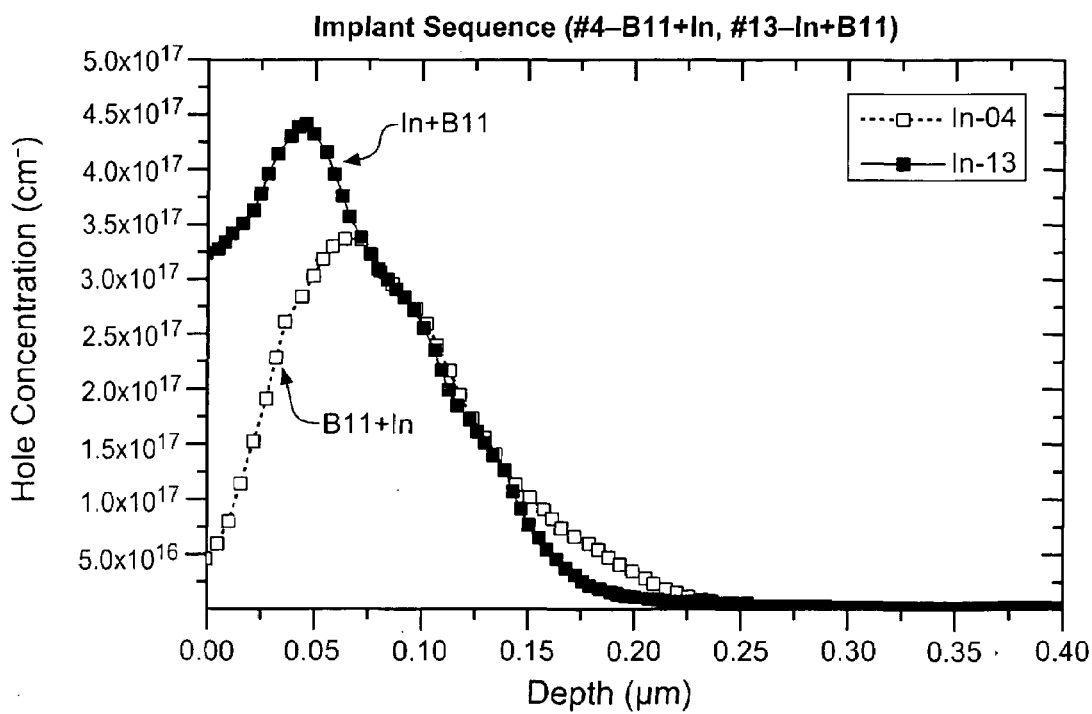
FIG. 4. is a graphical representation of hole concentration versus silicon substrate depth where (i) indium ion implantation into the silicon substrate was initiated prior to boron ion implantation (■) and (ii) boron ion implantation into the silicon substrate was initiated prior to indium ion implantation (□).

Now referring to FIG. 4, a graphical representation of the concentration of activated indium and boron dopants by dopant concentration depth in a semiconductor device subjected to the above described implantation method is shown. In particular, the curve represented by the symbol (■) depicts the concentration of indium and boron dopants by dopant concentration depth resulting from initiating the implantation of indium ions prior to initiating the implantation of boron ions into the semiconductor substrate. In contrast, the curve represented by the symbol (□) depicts the concentration of indium and boron dopants by dopant concentration depth resulting from initiating the implantation of boron ions prior to initiating the implantation of indium ions into the semiconductor substrate. As shown in FIG. 4, the method of initiating the implantation of indium ions prior to initiating the implantation of boron ions results in a higher concentration of holes (i.e. indium and boron ions) around the 0.05 micrometer depth. A high level of hole concentration at this depth is indicative of the formation of a steep retrograde doped channel and helps reduce the short channel effects associated with scaled downed semiconductor devices.

There are a plurality of advantages of the concepts of the present disclosure arising from the various features of the apparatus and methods described herein. It will be noted that alternative embodiments of the apparatus and methods of the present disclosure may not include all of the features described yet still benefit from at least some of the advantages of such features. Those of ordinary skill in the art may readily devise their own implementations of the apparatus and methods of the present disclosure that incorporate one or more of the features of the present disclosure and fall within the spirit and scope of the invention defined by the appended claims.

The invention claimed is:

1. A method of implanting ions in a silicon substrate, comprising:

advancing indium ions into said silicon substrate for a first time period;

advancing boron ions into said silicon substrate for a second time period, wherein said time period for advancement of said indium ions is initiated prior to said time period for advancement of said boron ions; and annealing said silicon substrate using an annealing process, wherein said annealing process includes (i) heating said silicon substrate to a first temperature of about 550 degrees Celsius to about 1,000 degrees Celsius, after said advancement of said indium ions and said boron ions into said silicon substrate and (ii) cooling said silicon substrate to a second temperature which is less than said first temperature after said heating, wherein said silicon substrate is cooled, at a cooling rate greater than 35 degrees Celsius per second.

2. The method of claim 1, wherein:
said advancement of said indium ions and said boron ions occurs in an environment which is substantially free of oxygen.

3. The method of claim 1, wherein:
said advancement of said indium ions and said boron ions is accomplished by an ion implantation process.

4. The method of claim 1, wherein:
said cooling rate is from about 50 degrees Celsius per second to about 90 degrees Celsius per second.

5. The method of claim 1, wherein:
said cooling rate is about 60 degrees Celsius per second.

6. The method of claim 1, wherein:
said cooling rate is about 80 degrees Celsius per second.

7. A method of disposing indium ions and boron ions below a surface of a semiconductor, comprising:
positioning a mask structure adjacent to said surface of said semiconductor, wherein said mask structure has an opening defined therein;
advancing said indium ions (i) through said opening of said mask structure and (ii) below said surface of said semiconductor;
advancing said boron ions (i) through said opening of said mask structure and (ii) below said surface of said semiconductor, wherein said advancement of said indium ions is initiated prior to said advancement of said boron ions; and
annealing said semiconductor using an annealing process, wherein said annealing process includes (i) heating said semiconductor to a first temperature of about 550 degrees Celsius to about 1,000 degrees Celsius, after said advancement of said indium ions and said boron ions and (ii) cooling said semiconductor to a second temperature which is less than said first temperature after said heating, wherein said semiconductor is cooled, at a cooling rate which is greater than 35 degrees Celsius per second.

8. The method of claim 7, wherein:
said advancement of said indium ions and said boron ions occurs in an environment which is substantially free of oxygen.

9. The method of claim 7, further comprising:
annealing said semiconductor subsequent to the advancement of indium and boron ions into said semiconductor and prior to the deposition of dopant diffusion into said semiconductor.

10. The method of claim 7, wherein:
said cooling rate is from about 50 degrees Celsius per second to about 90 degrees Celsius per second.

11. The method of claim 7, wherein:
said cooling rate is about 60 degrees Celsius per second.

12. The method of claim 7, wherein:
said cooling rate is about 80 degrees per second.

13. A method of fabricating a semiconductor device, comprising:
implanting indium ions into a substrate of a semiconductor material of said semiconductor device for a first time period;
implanting boron ions into said substrate for a second time period, wherein (i) said first time period is initiated prior to said second time period and (ii) said indium ions and said boron ions define a doped channel in said substrate; and
annealing said substrate using an annealing process, wherein said annealing process includes (i) heating said substrate to a first temperature of about 550 degrees Celsius to about 1,000 degrees Celsius after said implantation of said indium ions and said boron ions and (ii) cooling said substrate from said first temperature to a second temperature, wherein said cooling occurs at a rate of from about 50 degrees Celsius per second to about 90 degrees Celsius per second.

14. The method of claim 13, wherein:
said cooling rate is about 60 degrees Celsius per second.

15. The method of claim 13, wherein:
said cooling rate is about 80 degrees Celsius per second.

16. A method of fabricating a semiconductor device, comprising:
implanting indium ions into a substrate of a semiconductor material of said semiconductor device for a first time period at a dosage of about $0.8 \times 10^{13}$ per square centimeter;
implanting boron ions into said substrate for a second time period at a dosage of about $5 \times 10^{12}$ per square centimeter, wherein (i) said first time period is initiated prior to said second time period and (ii) said indium ions and said boron ions define a doped channel in said substrate; and
annealing said substrate using an annealing process, wherein said annealing process includes (i) heating said substrate to a first temperature of about 550 degrees Celsius to about 1,000 degrees Celsius after said implantation of said indium ions and said boron ions and (ii) cooling said substrate from said first temperature to a second temperature, wherein said cooling occurs at a rate greater than 35 degrees Celsius per second.

* * * * *